United States Patent [19]
Kuo

[11] Patent Number: 5,646,563
[45] Date of Patent: Jul. 8, 1997

[54] CHARGE PUMP WITH NEAR ZERO OFFSET CURRENT

[75] Inventor: James R. Kuo, Cupertino, Calif.

[73] Assignee: National Semiconductor Corporation, Santa Clara, Calif.

[21] Appl. No.: 723,698

[22] Filed: Sep. 30, 1996

Related U.S. Application Data

[63] Continuation of Ser. No. 275,575, Jul. 15, 1994, abandoned.
[51] Int. Cl.$^6$ ........................................................ H03L 7/06
[52] U.S. Cl. ........................ 327/157; 327/112; 327/111; 331/17
[58] Field of Search ........................................ 327/379, 437, 327/535, 536, 551, 111, 112, 108, 157, 404; 331/17

[56] References Cited

U.S. PATENT DOCUMENTS

| | | | |
|---|---|---|---|
| 4,922,141 | 5/1990 | Lofgren et al. | 327/277 |
| 5,120,992 | 6/1992 | Miller et al. | 327/111 |
| 5,155,384 | 10/1992 | Ruetz | 327/537 |
| 5,208,546 | 5/1993 | Nagaraj et al. | 327/157 |
| 5,362,990 | 11/1994 | Alvarez et al. | 327/536 |

OTHER PUBLICATIONS

Kim et al., "A 30–MHz Hybrid Analog/Digital Clock Recovery Circuit in 2–μm CMOS;" IEEE Journal of Solid–State Circuits, vol. 25, No. 6, Dec. 1990, pp. 1385–1394.

Young et al., "WP3.3: A PLL Clock Generator With 5 to 110 MHz Lock Range for Microprocessors," ISSCC 92/ Session 3/High–Performance Circuits/Paper WP 3.3, IEEE Int'l Solid State Circuits Conference, pp. 50–51.

Sedra et al., Microelectronic Circuits, 1991, p. 932.

*Primary Examiner*—Timothy P. Callahan
*Assistant Examiner*—Jung Ho Kim
*Attorney, Agent, or Firm*—Skjerven, Morrill, MacPherson, Franklin & Friel; David T. Millers

[57] ABSTRACT

A charge pump of a phase-locked loop includes a first P channel transistor and a first N channel transistor coupled to mirror a current in a constant current source. The P channel transistor and N channel transistor are formed with dimensions that match transient responses of currents through the N and P channel transistors during switching rather than matching the gains of the N and P channel transistors. In one embodiment, the channel length of the N channel transistor is twice a channel length of the P channel transistor. A second P channel transistor and a second N channel transistor connected in series with the first P and N channel transistors switch the current through the first P channel transistor and the first N channel transistor respectively. The second P channel transistor and the second N channel transistor have matched gate-drain capacitances so that they have the same switching speed. A first capacitor coupled between the gate of the first P channel transistor and a supply voltage and a second capacitor coupled between the gate of the first N channel transistor and a reference voltage reduce the effect that jitter in the supply and reference voltages has on the charge pump.

17 Claims, 4 Drawing Sheets

CHARGE PUMP WITH NEAR ZERO OFFSET CURRENT

This application is a continuation of application Ser. No. 08/275,575, filed Jul. 15, 1994, abandoned.

BACKGROUND OF THE INVENTION

1. Field of the Invention

This invention relates to charge pumps which supply closely matched up and down current pulses.

2. Description of Related Art

Charge pumps are commonly employed in phased-locked loops to control a voltage applied to a voltage controlled oscillator (VCO). FIG. 1 shows a typical application of a charge pump 120 in a phase-locked loop 100. Charge pump 120 controls a voltage Vout applied to a VCO 140. Voltage Vout depends on a current Ic to a filter 130. Current Ic is the difference between an up current Ip into a node 125 and a down current In out of node 125. A transistor 122 turns on and off a current source 124 that supplies up current Ip, charges node 125, and increases voltage Vout. A transistor 128 turns on and off a current source 126 that supplies down current In, discharges node 125, and decreases voltage Vout. Filter 130 reduces output voltage fluctuations caused by switching of up and down currents Ip and In.

A phase comparator or detector 110 provides control signals CNTRL_P and CNTRL_N for transistors 122 and 128 respectively. Phase comparator 110 compares a reference signal REF_IN to a signal VCO_IN which VCO 140 provides via an optional frequency divider 150. When the signals REF_IN and VCO_IN are in phase, phase-locked loop 100 is locked, and control signals CNTRL_P and CNTRL_N have matched duty cycle, phase, and frequency. Up and down currents Ip and In should be equal to maintain a constant output voltage Vout and constant frequency oscillation from VCO 140. If the signals REF_IN and VCO_IN are not in phase, phase comparator 110 changes the duty cycles of control signals CNTRL_P or CNTRL_N to change voltage Vout and change the frequency of oscillation of VCO 140. For example, when signal VCO_IN trails reference signal REF_IN, the duty cycle of control signal CNTRL_P is increased relative to the duty cycle of control signal CNTRL_N. The increased duty cycle increases the duration of up current Ip, charges node 125, increases voltage Vout, and increase the oscillation frequency of VCO 140.

Typically, in CMOS charge pumps, transistor 122 and current source 124 are P channel devices because P channel transistors handle supply voltage Vdd better, and transistor 128 and current source 126 are N channel devices because N channel devices handle reference voltage Vss better. P channel devices 122 and 124 and N channel devices 126 and 128 do not have identical responses to control voltages CNTRL_P and CNTRL_N because the charge carrier type used in current source 124 differs from the charge carrier type used in current source 126. Typically, P channel devices 122 and 124 are larger than N channel devices 126 and 128 to match the gain (also commonly referred to as β) of devices 122, 124, 126, and 128. FIG. 2 shows predicted plots of currents Ip, In, and Ic verses time for charge pump 120 wherein P channel devices 122 and 124 have channel widths 2.5 times the channel width of N channel devices 126 and 128 to match the gains. In FIG. 2, control signals CNTRL_P and CNTRL_N are asserted between times $0.22 \times 10^{-7}$ and $0.25 \times 10^{-7}$ seconds. (Control signal CNTRL_P is asserted low. Control signal CNTRL_N is asserted high.) Currents Ip and In increase and decrease in response to the control signals in a manner characteristic of P channel devices 122 and 124 and N channel devices 126 and 128 respectively.

Current Ic is the difference between current Ip and current In. As shown in FIG. 2, when phase detector 110 provides equal duty cycle control signals to transistors 122 and 128, net current Ic flows to node 125 and increases voltage Vout. VCO 140 oscillates faster, and signal VCO_IN gets out of phase with reference signal REF_IN. Phase comparator 110 then changes control signals CNTRL_P and CNTRL_N and decreases voltage Vout until signals VCO_IN and REF_IN are in phase again. Once signals VCO_IN and REF_IN are in phase, control signals CNTRL_P and CNTRL_N are equal, and voltage Vout rises again as described above. Voltage Vout increases and decreases repeatedly in this manner causing jitter in the signal provided by VCO 140. The jitter may be unacceptable in applications where VCO 140 provides a precise timing or clock signal.

Another source of jitter in voltage Vout and the signal provided by VCO 140 is relative fluctuations between supply voltage Vdd or reference voltage Vss and gate voltages in devices 122, 124, 126, and 128. Such fluctuation vary the gate-source voltages for devices 122, 124, 126, and 128 and cause amplified fluctuations in output voltage Vout. A better charge pump is needed to provide less jitter.

SUMMARY OF THE INVENTION

In accordance with an embodiment of this invention, a charge pump provides an output voltage by controlling the current into and out of a node coupled to a filter. Current into the node is controlled by P channel devices coupled to a supply voltage. Current out of the node is controlled by N channel devices coupled to a reference potential. Unlike prior art charge pumps which have N and P channel devices with equalized gains, the dimensions of the P channel and the N channel devices are selected so that in this invention, the P channel devices have nearly the same transient responses as the N channel devices.

A charge pump in accordance with this embodiment may be coupled to a phase comparator in a phase-locked loop, and when the phase comparator provides matched control signals (signals with equal duty cycle, frequency, and phase) for the P channel and N channel devices, the charge pump produces matched up and down current pulses that increase at about the same rate when being switched on, decrease at about the same rate when being switched off. Jitter in phase-locked loops caused by prior art charge pumps with unequal up and down current pulses is reduced.

Another embodiment of the invention is a charge pump which includes a constant current source, a P channel transistor coupled to mirror a current in the constant current source, and an N channel transistor also coupled to mirror the current of the constant current source. The P channel and N channel transistors are connected in series between a supply voltage and a reference voltage. A filter connected to a node between the P channel transistor and the N channel transistor provides an output voltage. Differences between the dimensions of the P channel transistor and the N channel transistor match time dependence of currents through the N channel and P channel transistors during switching. In one embodiment, the channel length of the N channel transistor is twice a channel length of the P channel transistor.

Typically, a second P channel transistor connected in series with the first P channel transistor switches current through the first P channel transistor, and a second N channel transistor connected in series with the first N channel transistor switches current through the first N channel transistor. The second P channel transistor and the second N channel transistor generally have matched gate-drain capacitances so that they switch at the same rate.

Additionally, a first capacitor may be coupled between the gate of the first P channel transistor and the supply voltage, and a second capacitor may be coupled between the gate of the first N channel transistor and the reference voltage. The capacitors reduce the effect of jitter in the supply and reference voltages used by the charge pump.

Another embodiment of the invention is a charge pump including a constant current source, a P channel transistor which mirrors a current of the constant current source, a first capacitor connected between a gate of the P channel transistor and a supply voltage supplying current through the P channel transistor, an N channel transistor which mirrors the current of the constant current source, and a second capacitor connected between a gate of the N channel transistor and a reference voltage sinking current from the N channel transistor.

Still another embodiment of the present invention is a phase-locked loop including a voltage controlled oscillator, a phase comparator, and a charge pump in accordance with any of the embodiments above.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
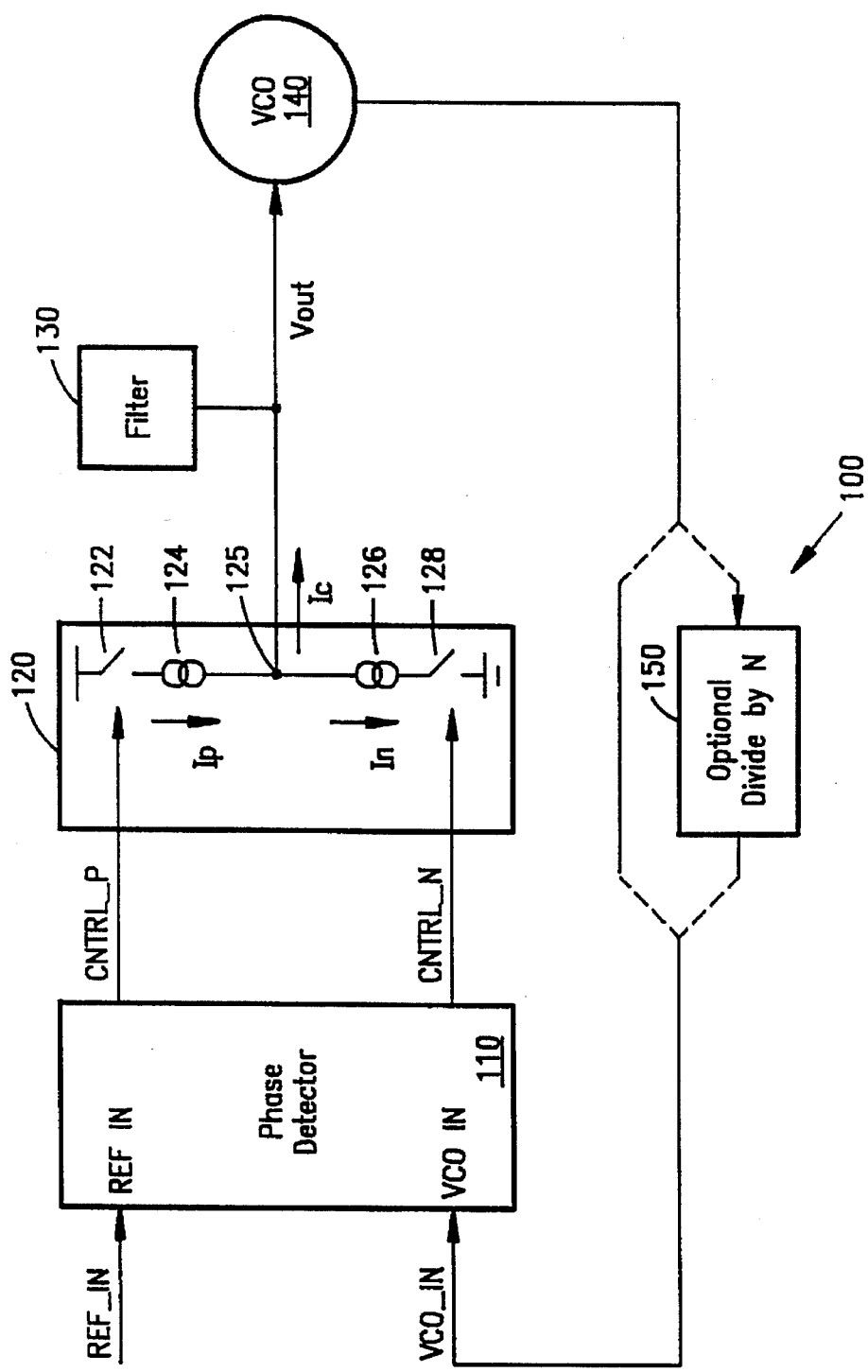
FIG. 1 shows a block diagram of a prior art phase-locked loop 100 containing a charge pump.
Figure 2:
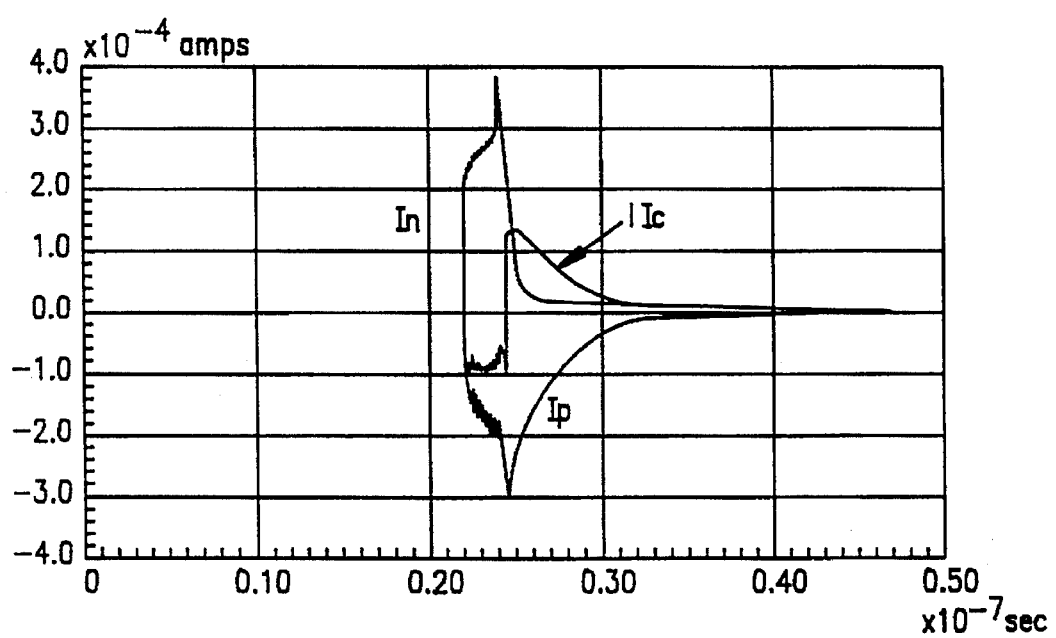
FIG. 2 shows a plot of current verses time for a typical up current, down current, and difference current in the prior art.
Figure 3:
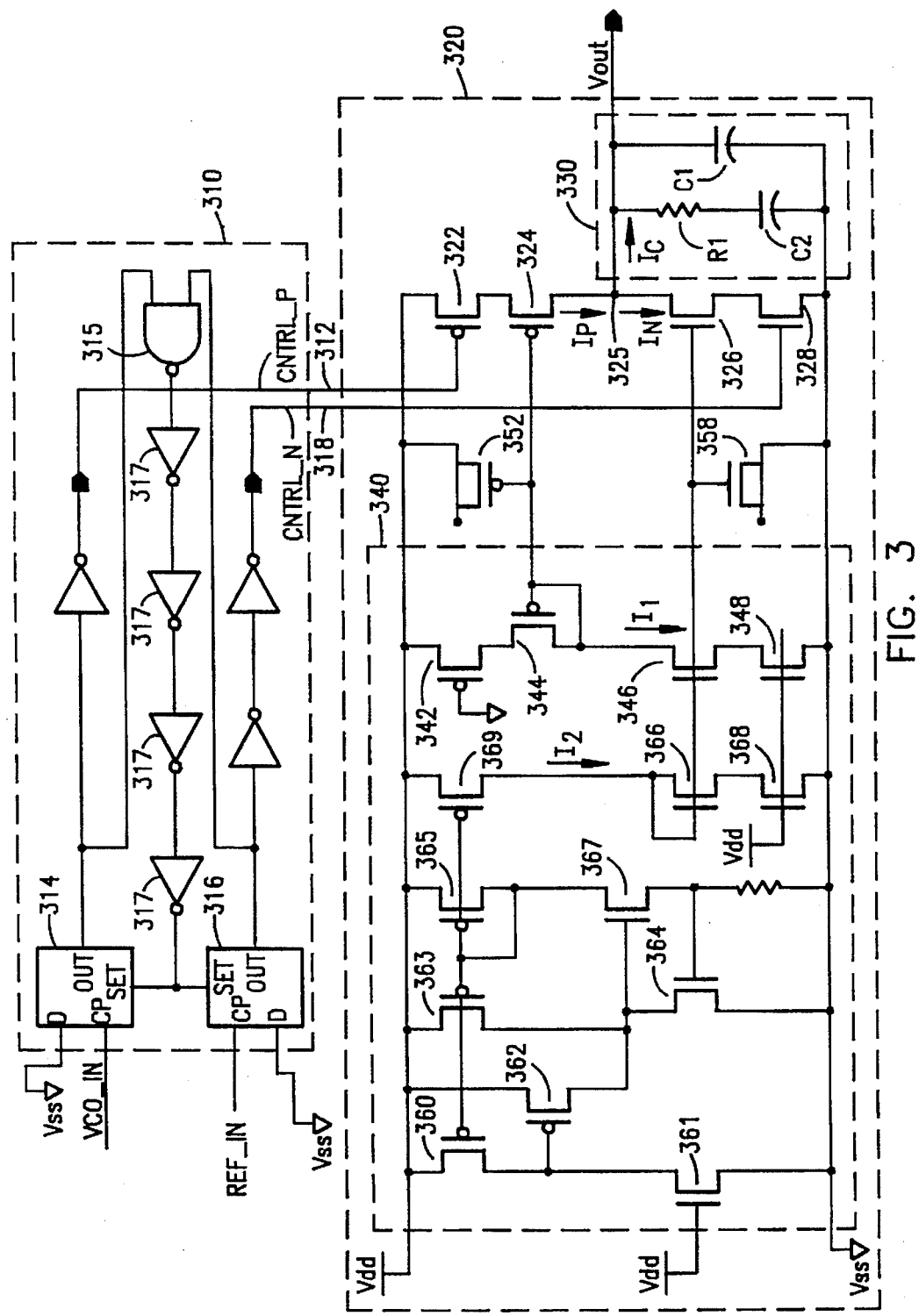
FIG. 3 is a circuit diagram of a phase comparator 320 and a charge pump 320 in accordance with an embodiment of this invention.

FIG. 3 shows a circuit diagram of a charge pump 320 in accordance with an embodiment of this invention. Charge pump 320 provides an output voltage Vout for a device (not shown). Output voltage Vout depends on the difference between an up current Ip which flows into a node 325 and a down current In which flows out of node 325. When maintaining a constant output voltage Vout, currents Ip and In are kept equal. Transistors 324 and 326 mirror a constant current source 340 to generate constant and matched currents Ip and In. A gate of P channel transistor 324 is coupled to constant current source 340 so that the maximum magnitude of up current Ip equals the magnitude of a current I1 in constant current source 340. N channel transistors 326 is also coupled to constant current source 340 to provide down current In with a maximum magnitude equal to current I1.

Transistors 324 and 326 have gate voltages fixed by constant current source 340. The dimensions of P channel transistor 324 and N channel transistor 326 are selected so that for the fixed gate voltages, the time dependence of pulses of current Ip match the time dependence of pulses of current In. For example, in one embodiment, N channel transistor 326 has a channel length that is twice the channel length of P channel transistor 324. The longer channel length of N channel transistor 326 compensates for the slower response inherent to P channel charge carriers in P channel transistor 324, and at the switching frequency of switching transistors 322 and 328, current through P channel transistor 324 increases and decreases at about the same rate as current through N channel transistor 326. Gate voltages of switching transistors 322 and 328 change to turn on and turn off currents Ip and In. Transistors 322 and 328 have matched capacitances and switch at nearly the same rate in response to currents which charge and discharge the gate. This embodiment of the present invention has less jitter in output voltage Vout than prior art charge pumps because differences in up and down current pulses are reduced, and currents Ip and In are closer to being equal.

To further reduce jitter, capacitors 352 and 358 are coupled between of gates of transistors 324 and 326 respectively and supply voltage Vdd and reference voltage Vss respectively. Capacitors 352 and 358 may be MOS capacitors formed using well known techniques. Alternatively, capacitors 352 and 358 may be P channel and N channel transistors respectively. If capacitor 352 and 358 are transistors, the ratio of channel width to channel length for capacitors 352 and 358 should be greater than the ratio of channel width to channel length for transistors 324 and 326 respectively so that capacitors 352 and 358 have lower threshold voltages than transistors 324 and 326. Lower threshold voltages ensure charge inversion in the channels of capacitors 352 and 358 and higher capacitance.

Capacitors 352 and 358 reduce jitter caused by fluctuations in supply voltage Vdd and reference voltage Vss. Such voltage fluctuations are commonly caused by changing current through inductive leads of an integrated circuit. When voltage Vdd or Vss varies the variation passes through capacitor 352 or 358 so that the gate, source, and drain voltages of transistor 324 or 326 fluctuate together. Since fluctuations in voltages Vdd and Vss change the gate-source voltages less, currents Ip and In remain more nearly constant.

Figure 4:
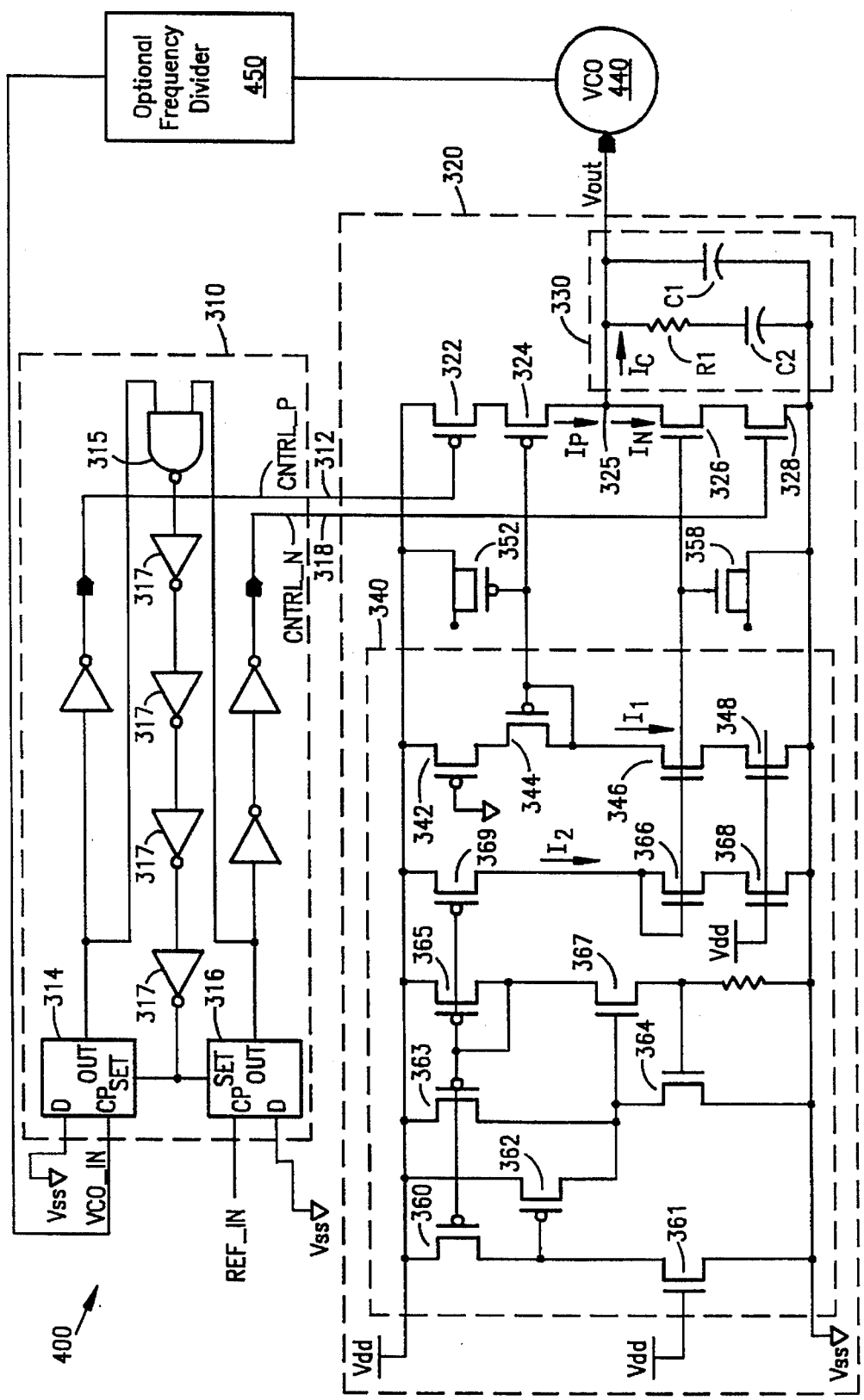
FIG. 4 shows a diagram of a phase-locked loop which includes a phase comparator and charge pump in accordance with the embodiment of FIG. 3.

FIG. 4 shows a typical application of charge pump 320 in a phase-locked loop with a voltage controlled oscillator (VCO) 440. In such application, output voltage Vout is supplied to the VCO 440 and controls the frequency of a signal generated by the VCO 440. The VCO 440 is coupled, possibly through a frequency divider 450, programmable counter, or other device, to a phase comparator 310. Many types of VCOs are known in the art including, for example a current starved ring oscillator.

During operation of phase-locked loop 400, phase comparator 310 receives a signal VCO_IN indicating the VCO's operating frequency and a reference signal REF_IN typically from an oscillator having an external crystal. Phase comparator 310 generates control signals CNTRL_P and CNTRL_N on lines 312 and 318 respectively. Control signal CNTRL_P on line 312 is asserted low to turn on P channel transistor 322 when a trailing edge in signal VCO_IN triggers a flip-flop 314. Control signal CNTRL_N on line 318 is asserted high to turn on N channel transistor 328 when a trailing edge in signal REF_IN triggers a flip-flop 316. A NAND gate 315 and inverters 317 reset flip-flops 314 and 316 after a fixed delay following both flip-flops 314 and 316 being triggered. If signals VCO_IN and REF_IN are in phase, signals CNTRL_N and CNTRL_P are in phase and have the same duty cycle.

When signal CNTRL_P is asserted, switching transistor 322 turns on, and up current Ip flows through transistors 322 and 324. When signal CNTRL_N is asserted, switching transistor 328 turns on, and down current In flows through transistors 326 and 328. A current Ic which flows into filter 330 is the difference between up current Ip into node 325 and down current In out of node 325. Current Ic depends on the differences in the duty cycle and phase of control signals CNTRL_P and CNTRL_N and on differences in response of up and down currents Ip and In through transistors 324 and 326 respectively when up and down currents Ip and In are switched on or off.

Filter 330 smooths the waveform of output voltage Vout while currents Ip and In are being switched. In one particular embodiment, filter 330 contains a resistor R1 having resistance of 7 kΩ, and capacitors C1 and C2 having capacitances of 8 pfd and 125 pfd respectively. In this embodiment, the frequency of control signals CNTRL_P and CNTRL_N is about 25 MHz. Using filters to smooth a voltage waveform is well known in the art, and a many other types of filter may be used in place of filter 330.

Transistors 342, 344, 346, and 348 of current source 340 are the same in type and dimensions as transistors 322, 324, 326, and 328 respectively and are connected in series between voltages Vdd and Vss as are transistors 322, 324, 326, and 328. The gates of transistors 342 and 348 are coupled to Vss and Vdd respectively so that transistors 342 and 348 match the electrical performance of transistors 322 and 328 respectively when phase comparator 310 turns on transistors 322 and 328.

The gate of transistor 344 is coupled to its drain and to the gate of transistor 324 so that transistors 324 and 344 form a current mirror. Accordingly, current Ip through transistor 324 mirrors current I1 through transistor 344. Transistor 344 being in series with transistor 346 conducts the same current I1. Transistors 346 and 326 have gates coupled to a gate of a transistor 366. Transistor 366 has gate and drain coupled together so that current I2 through transistor 366 is mirrored by transistors 346 and 326. Since transistors 346 and 326 are matched transistors and have gates at the same voltage, both transistor 346 and 326 conduct the same current I1. Transistors 360 to 365 and 367 to 369 act to provide through transistor 366 current I2 which is constant and insensitive to temperature changes and changes in supply voltage Vdd. Constant current sources are well known in the art. Many other constant current sources that may be used in place of current source 340 will be apparent to those skilled in the art.

Frequency responses of P channel transistor 324 and N channel transistor 326 are matched to equalize the transient responses of currents Ip and In during switching. A theoretical prediction of the unit gain bandwidth of a field effect transistor (FET) is given by eq. 1.

$$\omega_T \cong (g_m/C_{gs}) = (3/L)*[(\mu_0 I_D)/(2WLC_{OX})]^{1/2} \quad (\text{eq. 1})$$

In eq. 1, $g_m$ is the transconductance of the FET; $C_{gs}$ is the gate-source capacitance of the FET; L is the channel length of the FET; W is the channel width of the FET; $C_{OX}$ is the gate oxide thickness of the FET; $\mu_0$ is the mobility of charge carriers in the FET; and $I_D$ is the drain current in the FET.

In one particular embodiment, the drain current, gate oxide thickness, and channel width of P channel transistor 324 respectively equal the drain current, gate oxide thickness, and channel width of N channel transistor 326. In this embodiment, the ratio of the unit gain bandwidth $\omega_{TP}$ of P channel 324 to the unit gain bandwidth $\omega_{TP}$ of N channel 326 is given in eq. 2.

$$\omega_{TP}/\omega_{TN} = [\mu_{OP}/\mu_{ON}]^{1/2}[L_N/L_P]^{3/2} \quad (\text{eq. 2})$$

In eq. 2, $L_P$ and $\mu_{OP}$ are the channel length and charge carrier mobility of P channel transistor 324, and $L_N$ and $\mu_{ON}$ are the channel length and charge carrier mobility of N channel transistor 326. For typical doping levels in N and P channel FETs, the mobility $\mu_{ON}$ of charge carriers in an N channel transistor is about 2.5 times the mobility $\mu_{OP}$ of charge carriers in a P channel transistor, and eq. 2 indicates matched unit gain bandwidths when channel length $L_N$ of transistor 326 is about 1.4 times the channel length $L_P$ of transistor 324.

For short channel lengths, MOSFETs depart from eq. 1, and experiments show that for about equal channel widths, channel length $L_N$ being twice channel length $L_P$ provides better pulse matching between currents Ip and In in FIG. 3. For an alternate embodiment of this invention, both channel widths and lengths can differ. Optimal channel lengths and widths to equalize transient responses of P channel transistor 324 and N channel transistor 326 can be determined using well known simulation techniques and empirical data. A characteristic feature of this embodiment is that to match transient response, N channel transistor 326 is larger than P channel transistor 324. This is contrary charge pumps which have P channel transistors larger than N channel transistors to match the gains.

As an alternative to forming N channel transistor 326 with a channel length that differs from the channel length of P channel transistor 324, other difference in the dimensions of N channel transistor 326 and P channel transistor 324 can equalize the transient currents responses and reduce the differences between up and down currents Ip and In. For example, the channel widths of transistors 324 and 326 can differ, and differences in channel width alone or combined with different channel lengths can be used to match transient responses.

The dimensions of switching transistors 322 and 328 are also important to match pulses of currents Ip and In. If the gate-drain capacitance of transistor 322 equals the gate-drain capacitance of transistor 328, transistors 322 and 328 turn on (and off) at the same rate, and matched control signals CNTRL_P and CNTRL_N cause transistors 322 and 328 to turn on and off together. However, the gate-drain capacitance of transistor 322 can be made different from the gate-drain capacitance of transistor 328 to compensate differences in the transient response of transistors 324 and 326.

In one embodiment, transistors 322, 324, 326, and 328 are MOSFETs having a typical gate oxide thickness. P channel transistor 322 has a channel width of about 80 μm and a channel length of about 1 μm. P channel transistor 324 has a channel width of about 110 μm and a channel length of about 2 μm. N channel transistor 326 has a channel width of about 135 μm and a channel length of about 4 μm. N channel transistor 328 has a channel width of about 80 μm and a channel length of about 1 μm. Capacitors 352 and 358 have channel widths of 800 μm and 400 μm respectively and channel lengths of 6 μm. For matched control signals CNTRL_N and CNTRL_P, this embodiment reduces residual current Ic by a factor of 10 when compared to a charge pump with transistors 322 and 328 having matched gain, with transistors 324 and 326 having matched gain, and without capacitors 352 and 358.

Although the present invention has been described with reference to particular embodiments, the description is only an example of the invention's application and should not be taken as a limitation. In particular, FIG. 3 shows transistors 322, 324, 326, and 328 connected in series between supply voltage Vdd and a reference voltage Vss. As will be appreciated by those skilled in the art, the order of transistors 322, 324, 326, and 328 in the series connection can be varied if corresponding changes are made to transistors 342, 344, 346, and 348 in constant current source 340. Various other adaptations and combinations of features disclosed will be apparent to those skilled in the art and are within the scope of the present invention as defined by the following claims.

I claim:

1. A charge pump comprising:

a constant current source;

a P channel transistor having a gate coupled to the constant current source so that a current through the P channel transistor mirrors a current of the constant current source;

an N channel transistor having a gate coupled to the constant current source so that a current through the N channel transistor mirrors the current of the constant current source, wherein the P channel transistor and the N channel transistor are connected in series between a first voltage terminal and a second voltage terminal;

a first switching transistor connected in series with the P channel transistor, wherein a voltage applied to a gate of the first switching transistor controls whether current through the P channel transistor flows to a capacitive node between the P channel transistor and the N channel transistor; and a second switching transistor connected in series with the N channel transistor, wherein a voltage applied to a gate of the second switching transistor controls whether current through the N channel transistor flows from the capacitive node, wherein a difference between a dimension of the P channel transistor and a corresponding dimension of the N channel transistor equalizes transient responses that occur in the current through the P channel transistor and in the current through the N channel transistor when the first and second switching transistors turn on the currents through the P channel transistor and the N channel transistor.

2. The charge pump of claim 1, further comprising a filter coupled to the capacitive node.

3. The charge pump of claim 1, wherein the first switching transistor has a gate-drain capacitance equal to a gate-drain capacitance of the second switching transistor.

4. The charge pump of claim 3, wherein a channel length of the N channel transistor is between 1.5 and 2 times a channel length of the P channel transistor.

5. The charge pump of claim 3, further comprising a first capacitor coupled between the gate of the P channel transistor and the first voltage terminal.

6. The charge pump of claim 5, wherein the first capacitor comprises a second P channel transistor having a smaller threshold voltage than the first-mentioned P channel transistor.

7. The charge pump of claim 5, further comprising a second capacitor coupled between the gate of the N channel transistor and the second voltage terminal.

8. The charge pump of claim 7, wherein the second capacitor comprises a second N channel transistor having a smaller threshold voltage than the first-mentioned N channel transistor.

9. The charge pump of claim 1, wherein the N channel transistor and the P channel transistor have equal channel widths, and a channel length of the N channel transistor is between 1.5 and 2 times a channel length of the P channel transistor.

10. The charge pump of claim 1, further comprising a first capacitor coupled between the gate of the P channel transistor and the first voltage terminal.

11. The charge pump of claim 10, further comprising a second capacitor coupled between the gate of the N channel transistor and the second voltage terminal.

12. A phase-locked loop, comprising:

a voltage controlled oscillator;

a phase comparator;

means for connecting the voltage controlled oscillator to the phase comparator; and a charge pump comprising:

a constant current source; and a first P channel transistor, a second P channel transistor, a first N channel transistor, and a second N channel transistor coupled in series between first and second voltage terminals, wherein:

the first P channel transistor has a gate coupled to the constant current source so that a first current through the first P channel transistor mirrors a second current of the constant current source;

a gate of the second P channel transistor is coupled to the phase comparator;

the first N channel transistor has a gate coupled to the constant current source so that a third current through the first N channel transistor mirrors the second current of the constant current source;

a gate of the second N channel transistor is coupled to the phase comparator;

a difference between a dimension of the first P channel transistor and a corresponding dimension of the first N channel transistor equalizes transient responses in the first and third currents; and wherein the voltage controlled oscillator is coupled to a capacitive node between the first P channel transistor and the first N channel transistor.

13. The phase-lock loop of claim 12, wherein the charge pump further comprises a first capacitor coupled between the gate of the first P channel transistor and the first voltage terminal.

14. The phase-lock loop of claim 13, wherein the charge pump further comprises a second capacitor coupled between the gate of the first N channel transistor and the second voltage terminal.

15. The charge pump of claim 3, wherein the first switching transistor is a P channel transistors and the second switching transistor is an N channel transistor.

16. The charge pump of claim 1, wherein the difference between the dimension of the P channel transistor and the corresponding dimension of the N channel transistor equalizes transient responses that occur in the current through the P channel transistor and in the current through the N channel transistor when the first and second switching transistors simultaneously turn on the currents through the P channel transistor and the N channel transistor.

17. The phase-locked loop of claim 12, wherein when the voltage controlled oscillator provides to the phase comparator a signal having a desired frequency the phase comparator simultaneously turns on the second P channel transistor and the second N channel transistor, and wherein the difference between the dimension of the first P channel transistor and the corresponding dimension of the first N channel transistor equalizes transient responses in the first and third currents and maintains a constant voltage at the capacitive node.

\* \* \* \* \*

UNITED STATES PATENT AND TRADEMARK OFFICE
CERTIFICATE OF CORRECTION

PATENT NO.    :   5,646,563
DATED         :   July 8, 1997
INVENTOR(S)   :   Kuo, James R.

It is certified that error appears in the above-identified patent and that said Letters Patent is hereby corrected as shown below:

Col. 3, line 33, delete "320".
Col. 3, line 34, delete "320".

Signed and Sealed this

Eleventh Day of August 1998

Attest:

BRUCE LEHMAN

*Attesting Officer*            *Commissioner of Patents and Trademarks*